United States Patent [19]

Mårtensson

[11] 4,114,106

[45] Sep. 12, 1978

[54] ARRANGEMENT TO INDICATE SIGNALS HAVING A LENGTH EXCEEDING A LIMIT VALUE

[75] Inventor: Folke Lennart Mårtensson, Huddinge, Sweden

[73] Assignee: Telefonaktiebolaget L M Ericsson, Stockholm, Sweden

[21] Appl. No.: 755,035

[22] Filed: Dec. 28, 1976

[30] Foreign Application Priority Data

Jan. 23, 1976 [SE] Sweden ................................ 7600714

[51] Int. Cl.² .......................................... H03K 17/00
[52] U.S. Cl. .................................... 328/111; 328/110; 307/232
[58] Field of Search ................ 328/110, 111; 307/232, 307/234, 265

[56] References Cited

U.S. PATENT DOCUMENTS

| 3,634,869 | 1/1972 | Hsueh | 328/110 |
| 3,753,130 | 8/1973 | Pezzatti | 328/110 |
| 3,906,378 | 9/1975 | Takahashi et al. | 328/110 |
| 3,996,523 | 12/1976 | Schmid | 328/110 |

Primary Examiner—Stanley D. Miller, Jr.
Assistant Examiner—B. P. Davis
Attorney, Agent, or Firm—Hane, Roberts, Spiecens & Cohen

[57] ABSTRACT

A single-shot element, an interruption element and a valuation device are arranged for indicating signal pulses having a duration which exceeds a limit value and to suppress disturbing pulses having durations which are less than the limit value. Upon each leading edge of any pulse, the single-shot element begins to generate a control pulse which ends either due to an interruption or when its duration reaches the limit value. The interruption element interrupts the control pulses by means of the trailing edges of the disturbing pulses. While uninterrupted control pulses cause, the valuation device to generate indication signals which indicate a signal pulses.

6 Claims, 3 Drawing Figures

ARRANGEMENT TO INDICATE SIGNALS HAVING A LENGTH EXCEEDING A LIMIT VALUE

BACKGROUND OF THE INVENTION

The present invention relates to an arrangement to indicate, within an incoming pulse train, only signal pulses having a duration exceeding a limit value, and which includes logical circuits for generating a control pulse train by means of the incoming pulse train and for processing the logical values in said control pulse train and incoming pulse train.

Data processing systems and telecommunication systems such as those that are stored program controlled process signals consisting of pulse trains. Before a pulse processing arrangement receives a pulse train the pulses are usually regenerated, for example, by means of a trigger. The generation produces mainly rectangular pulses in the train, i.e. pulses having the same polarity, sharp leading and trailing edges, and amplitudes that are as uniform as possible, respectively. The regenerated pulse train represents the one and zero states for the pulse processing logical circuits which are expected to respond to the sharp edges of the pulses as fast as possible and, for example when generating intermediate or control signals, to produce pulses with equally sharp edges. It is, however, necessary to be aware of that the pulse edges are in fact not rectangular and that it is in fact impossible to neglect the reaction times. Theoretically the output of an AND-gate, for example, should never be activated when its two inputs, of which one is inverting, receive identical pulse trains. In practice, due to the inverting, different steepnesses and different reaction times are present at the inputs so that the AND-gate generates disturbing pulses. The more sensitive the logic circuits used, the greater the risk that they themselves generate disturbing pulses which are processed by equally sensitive responsive circuits as real signal pulses, although such disturbing pulses only have durations corresponding to the reaction times of the circuits. The consequence will be an erroneous processing result. For instance when counting pulses the leading edges of all incoming pulse are counted irrespective of whether they belong to the signals or the disturbing pulses.

As examples of known arrangements, the purpose of which is to extinguish disturbing pulses being transmitted together with signal pulses, solutions are shown in to the German patent applications Nos. 1,246,025, 1,462,800, 2,165,461 and 2,327,671. It is easy to realize that such goal is most difficult to achieve if it is furthermore demanded that the signal pulses are neither to shortened nor delayed. Such additional demands lead to complicated arrangements with a feed-back circuit system, often having a capacitor charging circuit in the feed-back path or forcing a periodic feeding of the signals controlled by means of a special pulse generator. It should be mentioned in advance that the proposed arrangement according to the invention generates indication signals, each of which indicating an incoming signal pulse, i.e. that signal delays and shortenings are permitted. Furthermore it is obvious that the suppression of the disturbing pulses is easier if such pulses only appear immediately before or after a signal pulse as is the case, for example, when bounce pulses appear in connection with the working or releasing of a relay spring contact. The bounce pulses and the pauses between the pulses then appear in a characteristic way which is based on the spring properties. However, a sensitive logical circuit also processes disturbing pulses, which occur between the signal pulses, for example due to inductive crosstalk from adjacent cables, causing arbitrary pulse and pause lengths.

SUMMARY OF THE INVENTION

The apparatus according to the invention receives an arbitrary pulse train, indicates only pulses which are longer than a unit of time, suppresses pulses which are shorter than such unit of time on the assumption that the pauses of the pulse train are longer than the reaction time of the circuits of the arrangement, and does not itself generate disturbing pulses which a subsequent processing arrangement would treat as indication signals.

BRIEF DESCRIPTION OF THE DRAWING

The arrangement according to the invention, the characteristics of which appear from the claims, will be described below by means of the accompanying drawing wherein:

Besides the circuit diagram of the arrangement each Figure contains a number of timing diagrams to show mutual pulse and signal relations which arise due to the operation and the reaction times of the logical circuits. It is assumed that the pulses are generated with perpendicular edges. It will appear from the description that at least the arrangement according to FIG. 3 reliably operates on pulses with varying edge steepnesses.

Figure 1:
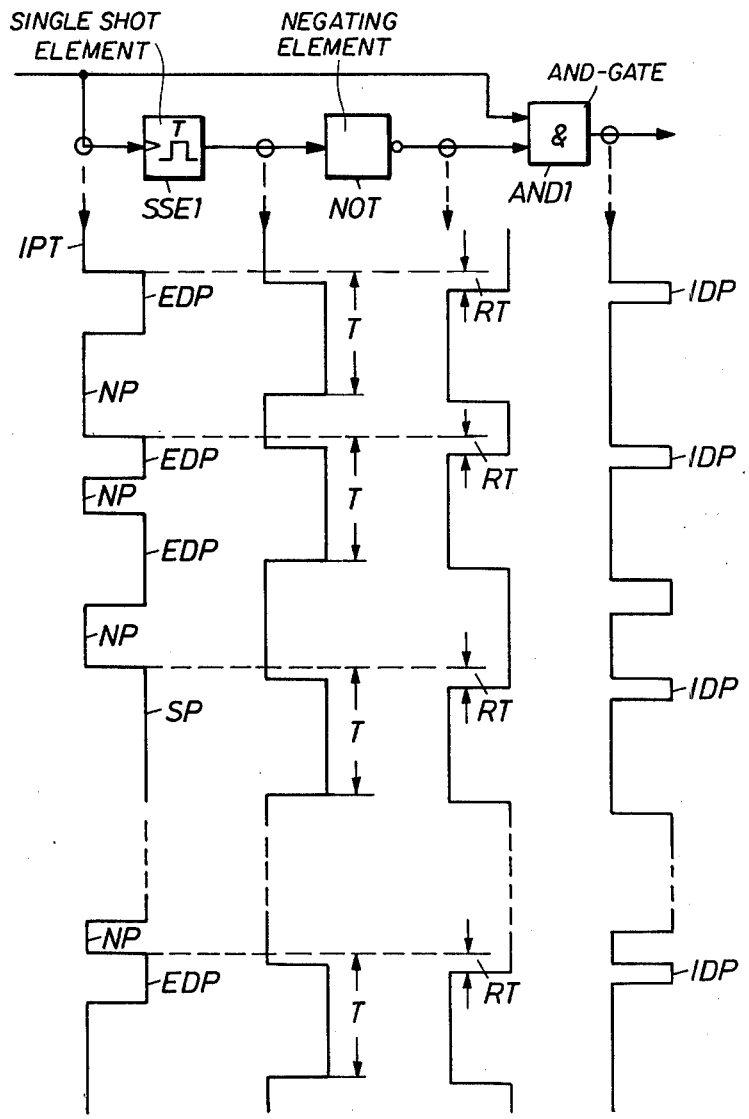
FIG. 1 shows the prior art according to above-cited German Pat. No. 1,246,025.
Figure 2:
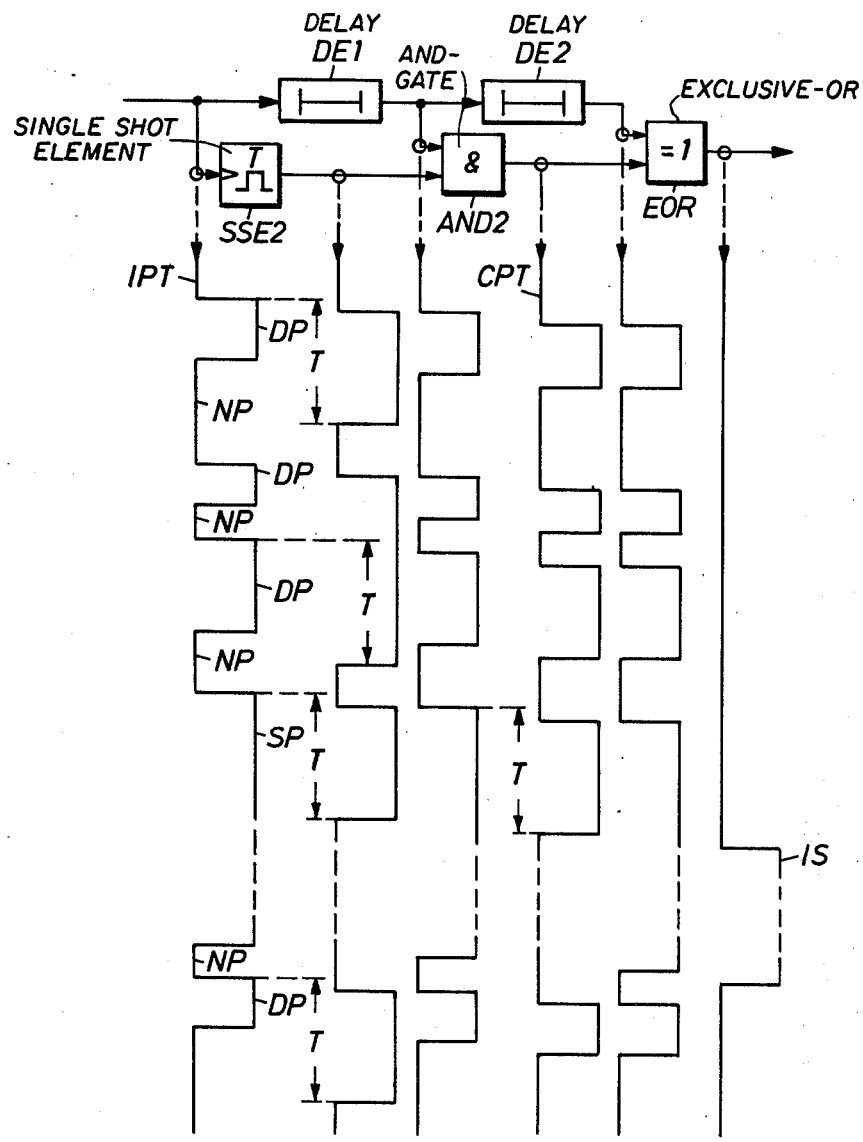
FIG. 2 shows an arrangement according to the invention which is provided with two delay elements.

FIG. 1 shows that an AND-gate AND1 of the arrangement described in German Pat. No. 1,246,025 generates disturbing pulses IDP by itself due to the reaction time of a series circuit comprising a negating element NOT and a single-shot element SSE1 of a first type. The element SSE1 is triggered to the one-state by the leading edge of an input signal and remains in this one-state for a unit of time T irrespective of whether or not the input signal changes. However, the known arrangement according to FIG. 1 does not generate any internal disturbing pulses IDP if it is assumed that AND-gate AND1 receives the incoming pulse train IPT consisting of signal pulses SP, external disturbing pulses EDP and pauses NP through a delay element, not shown, the characteristic delay of which corresponds to the total reaction time RT of the series circuit. In this case the known arrangement suppresses incoming disturbing pulses EDP having a length or duration which is shorter than the unit of time T, except for such a disturbing pulse having leading and trailing edges which are inside and outside, respectively, the unit of time pulse generated by the single-shot element SSE1 in response to a preceding disturbing pulse. In order to also suppress such exceptional disturbing pulses the known arrangement has an additional single-shot element which is not shown in FIG. 1. This element has a characteristic unit of time which is so small that the leading edge of the exceptional pulse definitely triggers the additional element. However, it is required that there is a relation between the disturbing pulses EDP and the pauses NP which guarantees that the length of the exceptional pulse is shorter than such small unit of time. Such a pre-requisite exists when having the bounce pulse conditions as mentioned above, but when having arbitrary pulse-pause-relations of the incoming pulse train, the known arrangement fails. In addition, it will be still more difficult to dimension such a delay-element if AND-gate AND1 is provided with two inputs each connected to a single-shot element. FIG. 2 shows a fundamental embodiment of the invention. The incoming pulse train IPT consists of signal pulses SP which are longer than a unit of time T, disturbing pulses DP which are shorter than unit of time T and pauses NP which are longer than the reaction times appearing in the circuits of the arrangement, but otherwise have quite arbitrary lengths. The incoming pulse train is supplied to a single-shot element SSE2 of a second type, delayed to an AND-gate AND2 and furthermore delayed to an evaluating circuit which in FIG. 2 is an EXCLUSIVE-OR-gate EOR.

The single-shot element SSE2 starts the generation of a control pulse by means of the leading edge of each incoming pulse, the control pulse ending after a unit of time T. If a subsequent leading edge should occur during an already started unit of time, a generation of a control pulse starts again. A single shot element of said second type (a retriggerable single shot) is composed of, for example, a capacitor, the charging or discharging process of which represents the one-state of the element and is started by means of each incoming leading edge irrespective of whether the preceding process is finished or not. The single-shot element SSE2, the output of which is connected to said AND-gate AND2, has a reaction time which is compensated by means of a first delay element DE1 so that the leading edges of the control pulses coincide with respective leading edges of the delayed incoming pulse train. Apart from the resulting delay a control pulse train CPT is obtained on the output of the AND-gate AND2 corresponding to the incoming pulse train IPT, except that the length of the signal pulses SP is mainly equal to the unit of time T. By means of a second delay element DE2 the incoming pulse train and the control pulse train are transferred to EXCLUSIVE-OR-gate EOR so that respective leading edges coincide. By means of the logical exclusive-or operation there is obtained as an evaluating result on the output of the EXCLUSIVE-OR-gate that the pulses arising due to the disturbing pulses neutralize each other while the portions of the signal pulses appear as indication signals IS.

The arrangement shown in FIG. 2 has the disadvantage that two delay elements must exactly compensate respective reaction times and that respective pulse edges must have the same slope, otherwise internal disturbing pulses will arise, in the same way as with already-known arrangements, questioning the reliability of the arrangement. However, it is possible, while keeping the principle according to FIG. 2, to avoid such disadvantage if the single-shot element SSE2 of the second type, the first delay element DE1 and the AND-gate AND2 are constituted of a monostable flip-flop element known per se which is provided with a so called clear-input, and if EXCLUSIVE-OR-gate EOR and second delay element DE2 are replaced for example by an edge controlled AND-gate which is described more in detail below.

Figure 3:
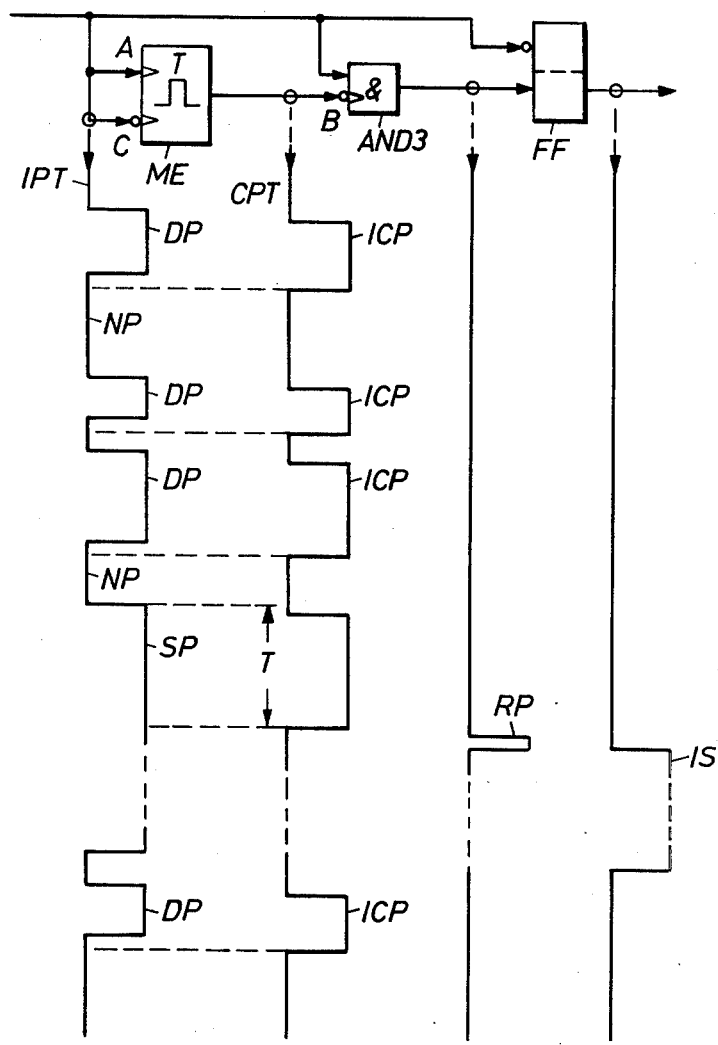
FIG. 3 shows a modified embodiment not requiring delay elements.

Monostable element ME shown in FIG. 3 is defined for example by means of the designation 74123 published by "Joint Electron Device Engineering Counsil (JEDEC)". The flip-flop is provided with two dynamic inputs A and C, both receiving the incoming pulse train IPT. Input A is active only due to a transition from zero to one-state, i.e. due to a pulse leading edge, and starts the generation of a control pulse. Input C, the so called clear-input, is active only due to a transition from one to zero-state, i.e. due to a pulse trailing edge, and interrupts the generation of a control pulse. If there is not interruption, the control pulse ends a unit of time T which is characteristic for the flip-flop after the activation of the flip-flop by means of input A. Owing to mutual reaction times a control pulse train CPT is obtained on the output of the flip-flop and it is possible that the interrupted pulses ICP of the control pulse train have another length and another edge steepness than the respective disturbing pulses DP, but they always have a trailing edge which occurs during a pulse pause NP of the incoming pulse train. This fact is utilized by connecting the output of the monostable element ME to a dynamic input B of an edge controlled AND-gate AND3, the second input of which receives the incoming pulse train. Input B is active only in response to the trailing edges of the control pulse train. Thus because of this property the output of the edge controlled AND-gate AND3 remains unactivated for trailing edges occurring during a pulse pause following a disturbing pulse, but it generates a short reaction pulse RP for trailing edges of control pulses occurring during a signal pulse. The reaction pulses can be used as signal indication pulses or used to set a bistable flip-flop to one of its two states. If the pauses in the incoming pulse train are used to set the bistable flip-flop to the other of its two states, then the embodiment according to FIG. 3 generates indication signals IS on the output of the bistable flip-flop FF, which indication signals on the whole correspond to the indication signals from the fundamental embodiment according to FIG. 2.

The edge controlled AND-gate AND3 and the bistable flip-flop FF together carry out an operation which also is obtained by means of a so called master slave flip-flop known per se, for instance defined by the JEDEC-designation 74S112. The clear input and the trailing edge triggered clock input of such master slave flip-flop receives the incoming pulse train and the control pulse train generated by said monostable element ME, respectively.

I claim:

1. In a system for transmitting data as a train of input pulses including data pulses having durations greater than a given time and disturbing pulses having durations less than the given time, apparatus for indicating the reception of each data pulse and the suppression of any disturbing pulses comprising: control pulse generating means for generating a train of control pulses, said control pulse generating means including means responsive to the leading edge of an input pulse of the input pulse train to start the generation of a control pulse and means responsive to the trailing edge of said input pulse in the input pulse train to terminate the control pulse if the time between the leading and trailing edges of said input pulse is less than said given time and otherwise terminating the control pulse said given time after the start of its generation; and sampling means coincidently responsive to the train of control pulses and input pulses for only emitting an output pulse when at least a portion of an input pulse is present during the absence of a control pulse, each of said output pulses indicating the reception of an input pulse.

2. The apparatus of claim 1 wherein said control pulse generating means comprises a single-shot element for receiving the input pulses and an AND-gate having two inputs for receiving pulses from the single-shot element and the input pulses.

3. The apparatus of claim 1 wherein the coincidence means comprises a two-input EXCLUSIVE-OR-gate for receiving the input pulses and the control pulses.

4. The apparatus of claim 1 wherein said control pulse generating means comprises a monostable flip-flop element including means responsive to the leading edge of an input pulse to set the flip-flop element to a first state and means responsive to the trailing edge of an input pulse to set the flip-flop element to a second state, said flip-flop element automatically switching from the first state to the second state in said given time if not sooner set to the second state.

5. The apparatus of claim 4 wherein said sampling means comprises an AND-gate having a first input for receiving the input pulses and a trailing edge triggered input connected to the output of said monostable flip-flop element.

6. The apparatus of claim 5 wherein said sampling means further comprises a master-slave flip-flop having a trailing-edge triggered clock input connected to the output of said AND-gate and a clear input, operative on trailing edges, for receiving the input pulses.

* * * * *